United States Patent
Wetzker

(10) Patent No.: US 7,277,499 B2
(45) Date of Patent: Oct. 2, 2007

(54) ADDITIVE DC COMPONENT DETECTION INCLUDED IN AN INPUT BURST SIGNAL

(75) Inventor: Gunnar Wetzker, Eindhoven (NL)

(73) Assignee: NXP B.V., Eindhoven (NL)

( * ) Notice: Subject to any disclaimer, the term of this patent is extended or adjusted under 35 U.S.C. 154(b) by 498 days.

(21) Appl. No.: 10/503,045

(22) PCT Filed: Jan. 20, 2003

(86) PCT No.: PCT/IB03/00213

§ 371 (c)(1),
(2), (4) Date: Jul. 29, 2004

(87) PCT Pub. No.: WO03/065568

PCT Pub. Date: Aug. 7, 2003

(65) Prior Publication Data

US 2005/0058221 A1  Mar. 17, 2005

(30) Foreign Application Priority Data

Feb. 1, 2002  (EP) .................... 02075426

(51) Int. Cl.
*H03K 9/00* (2006.01)
*H04B 1/10* (2006.01)
*H04B 3/46* (2006.01)
*H04L 25/06* (2006.01)
*H04L 7/04* (2006.01)
*H04L 7/00* (2006.01)
*H03D 3/24* (2006.01)

(52) U.S. Cl. ............ 375/316; 375/350; 375/319; 375/225; 375/362; 375/368; 375/375

(58) Field of Classification Search ............ 375/350, 375/316, 225, 319, 362, 365, 368, 375
See application file for complete search history.

(56) References Cited

U.S. PATENT DOCUMENTS

| | | | | |
|---|---|---|---|---|
| 4,398,216 A | * | 8/1983 | Field et al. ............ | 380/238 |
| 4,833,418 A | * | 5/1989 | Quintus et al. ............ | 330/9 |
| 5,721,486 A | * | 2/1998 | Pape ............ | 324/207.25 |
| 5,867,533 A | * | 2/1999 | Fleek et al. ............ | 375/279 |
| 5,875,212 A | * | 2/1999 | Fleek et al. ............ | 375/329 |
| 5,949,829 A | * | 9/1999 | Kawai ............ | 375/334 |
| 6,222,878 B1 | * | 4/2001 | McCallister et al. ............ | 375/225 |
| 6,480,046 B1 | * | 11/2002 | Camp, Jr. ............ | 327/122 |
| 6,504,884 B1 | * | 1/2003 | Zvonar ............ | 375/346 |
| 6,661,858 B1 | * | 12/2003 | Beaudin ............ | 375/350 |
| 2001/0021232 A1 | * | 9/2001 | Muraoka ............ | 375/319 |
| 2003/0098806 A1 | * | 5/2003 | Green ............ | 341/144 |
| 2003/0099310 A1 | * | 5/2003 | Zvonar ............ | 375/340 |
| 2005/0143031 A1 | * | 6/2005 | Moonen et al. ............ | 455/168.1 |

* cited by examiner

*Primary Examiner*—Mohammed Ghayour
*Assistant Examiner*—Nurul M Matin
(74) *Attorney, Agent, or Firm*—Peter Zawilski

(57) ABSTRACT

A method for processing an input burst signal comprising a first step for identifying an additive DC component and generating an output signal, which is representative for an estimated value of said DC component. The method further comprises a second step for detecting a predetermined signal portion from a plurality of possible signal portions included in the input burst signal and generating a control signal indicating the presence of the predetermined signal portion in the input burst signal. The method is characterized in that the first step and the second step are performed in parallel i.e. in a commonly defined time interval from a starting time of the burst.

16 Claims, 4 Drawing Sheets

ADDITIVE DC COMPONENT DETECTION INCLUDED IN AN INPUT BURST SIGNAL

Figure 1:
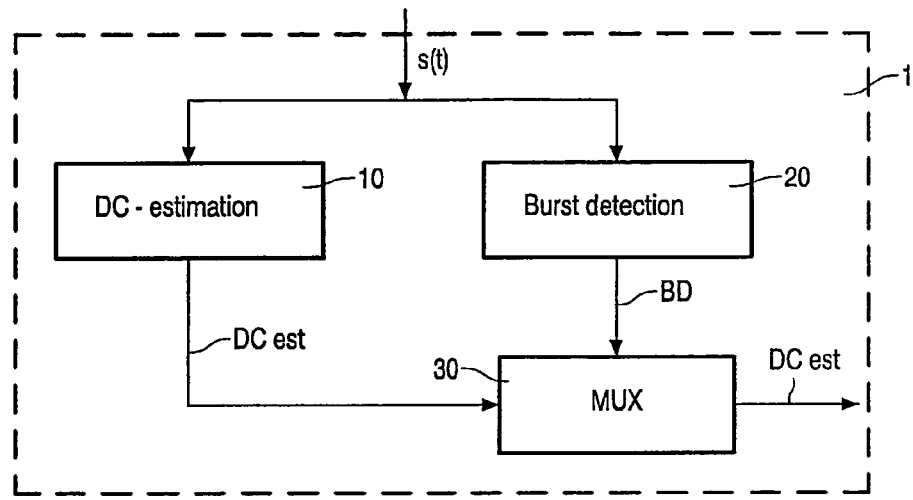

The invention relates to the detection of an additive DC component included in an input burst signal as described in the preamble of claim 1.

Additive DC components as described in this document are considered to be constant value or relatively slow varying electrical signals that are added to a time variable signal s(t). In real life systems a typical additive DC component is an offset voltage or current that is added to a time varying signal. In many practical situations this DC component does not involve major set backs in the behavior of the system where they appear. But there are situations when the DC signal could determine relatively major errors in a system. This is the case in e.g. Bluetooth and DECT systems which use frequency modulation of digital data and more precise GFSK modulation. In a first part of a Bluetooth signal a preamble is represented by a predefined succession of symbols indicating the start of a transmission of a burst signal. The burst signal appears randomly i.e. in a moment when a user makes a request for a Bluetooth service. In a Bluetooth receiver the received burst signal is demodulated and it is passed through a slicer. The slicer is basically a decision circuit e.g. a comparator indicating whether the demodulated signal has an amplitude higher or lower than a reference value. When a DC offset signal is present in the demodulated signal the slicer decision could be influenced such that it would not provide a correct information at it's output i.e. a predefined succession of symbols of +1 and −1 could be altered resulting in another succession of symbols. This is a problem of particular interest when a preamble of a burst signal is transmitted indicating a request for a service of Bluetooth or DECT systems. If the preamble of the burst is not correctly identified the request is not identified and it must be repeated. It, is therefore necessary to evaluate the DC component of the burst signal. It should be emphasized that the DC component appears as a direct consequence of a frequency error between the input signal and the frequency of signal generated by a local oscillator. Therefore, the estimated DC component is used as a feedback signal for controlling the local oscillator in order to obtain as low as possible DC offset components.

In U.S. Pat. No. 6,104,238 it is described a FM demodulator that uses a DC offset estimator. The DC offset estimator is coupled between a detector and a slicer. The DC offset estimator provides an estimation of a DC offset of the signal received from the detector to a slicer and to a local oscillator. The slicer uses the DC offset estimation as a threshold voltage. It is assumed that the transmitter transmits a DC free signal as a preamble to the input signal. It is further indicated that the DC estimator comprises a low-pass filter i.e. an integrator in combination with a sample and hold circuit and synchronization circuitry for keeping the samples in line with the demodulator timing. It should be pointed out that even if the transmitted signal is DC free a DC component could appear because of the demodulation process. Furthermore, in burst mode, a predefined succession of bits must be identified. With the solution provided in the above-mentioned patent, the predefined succession of bits could be identified reliably only after the slicer has introduced a supplementary delay in signal reception.

It is therefore an object of the present invention to provide a method performing a detection of a DC component in a relatively small time period i.e. with a relatively high speed.

In accordance with the invention this is achieved using a method as described in preamble of claim 1 being characterized in that the first step and the second step are performed in parallel i.e. in a commonly defined time period from a starting moment of the burst.

In burst mode, a receiver has to identify the beginning of the burst, called preamble, coinciding with the beginning of reception. This is realized using a predefined sequence of bits as in Bluetooth and DECT standards. A DC component, which is an additive component, included in the burst must be first estimated and after that the predefined sequence can be identified. It results that an additional delay necessary for the detection of the predefined sequence is needed. In the method according to the invention the time necessary for the identification of the predefined sequence is substantially reduced in that the DC estimation and the predefined sequence detection are realized in parallel i.e. in a substantially equal time period from a given moment.

In an embodiment, burst detection is realized in a third step and in a fourth step. In the third step the signal is first differentiated. Differentiation has as a main consequence the disappearance of any DC component. The predefined sequence is transformed in another predefined sequence by differentiation. Therefore the another predefined sequence is detected reliably. Because the burst comprises the predefined portion of the input burst signal it follows that, after differentiating that predefined portion, is obtained a well-defined portion of the signal. This well-defined portion of the signal is compared to the another predefined signal portion and if they are substantially equal to each other is generated a signal indicating that the input burst signal comprises the predefined signal portion.

In another embodiment of the invention the circuit for detecting an additive DC component of a input burst signal comprises a first module for estimating the additive DC component and generating a signal indicative for an estimation of a DC offset of the input burst signal. The circuit further comprises a second module for detecting a signal portion from a plurality of possible signal portions included in the input burst signal. The second module generates a control signal indicative for a presence of the signal portion from the plurality of the possible signal portions. The first module and the second module operate in the same time interval i.e. the elapsed time from the input moment of the input burst signal in the circuit and generation of the signals from each of the first module and the second module are significantly equal to each other.

In another embodiment of the invention the second module of the circuit comprises a third module for differentiating the input burst signal and obtaining a differentiated signal. The third module differentiates is coupled to a signal identification circuit. The signal identification circuit is operable to identify the differentiated signal as a predetermined one of another plurality of signal portions representing a derivative of the plurality of possible signal portions included in the input burst signal.

In an embodiment the control signal is a binary signal. Furthermore the control signal controls a switch coupled to the first module for generating the additive DC component when the signal portion from the plurality of possible signal portions included in the input burst signal is detected. It should be pointed out here that the DC estimation is performed continuously on an input burst signal in the circuit. The signal generated by the first module is further used in the circuit only if a predefined portion of the signal is detected in the second module. In another embodiment of the invention the estimated DC component is inputted in the burst detection circuit for eliminating an error that could appear in detecting the signal portion from the plurality of possible signal portions included in the input burst signal. This coupling between the first module and the second module via the DC estimated signal makes unnecessary the presence of the differentiating circuit in the second module. This conducts to a simplified design for the second module reducing costs at the price of a relatively longer time necessary for generating the DC estimation signal that is used outside the circuit. In should be emphasized that the input burst signal could be either analogic or digital. If the signal is analogic then the predefined portion of it could be for example in the form of an electrical signal such a voltage or a current, or in a form of an optical, such as a light intensity. The signal could be phase, frequency and amplitude modulated. The signal portion refers to a specified succession of symbols or bits when a digital signal is considered. In this case, in an embodiment of the invention the signal identification circuit comprises a first serial to parallel converter for converting the input burst signal from a serial stream of symbols to a first parallel stream, said serial to parallel converter being coupled to a first multiplier. The first multiplier multiplies the first parallel stream with a differentiated counterpart of a signal portion included in the input burst signal and generates a first product signal. The first product signal is inputted in a modulus circuit coupled to the multiplier. The modulus circuit performs a modulus determination of the first product signal and generates a first modulus signal, the first modulus signal being inputted in a threshold detector coupled to the modulus circuit. The threshold detector compares the first modulus signal and a threshold signal which is indicative for detection of a signal portion of the input burst signal s(t), the threshold detector generating the control signal whenever an input signal portion was detected. The DC estimation circuit comprises a second serial to parallel converter for converting the input burst signal from a serial stream of symbols to a second parallel stream. The second serial to parallel converter is coupled to a second multiplier. The second multiplier multiplies the second parallel stream with a predetermined set of symbols. The second multiplier generates a second product signal that is inputted to a first adder circuit coupled to the second multiplier, the first adder adding the plurality of components included in the second product signal to each other. The first adder generates a first adding signal, said first adding signal being inputted in an amplifier coupled to the adder. The amplifier performs an amplification of the first adding signal with an amplification factor depending on the predetermined set of symbols, the amplifier generating the estimated signal.

Let us consider that the input burst signal has the form shown in relation (1), $$s(t) = \sum_{i=-\infty}^{\infty} s_i g(t - iT) + DC \quad (1)$$

where $s_i$ is a symbol and $g(t-iT)$ is a periodically sampling function having a period T and DC is the additive DC component i.e. it is relatively constant in time. An estimation of the DC component is given in relation (2)

$$S_D(t) = \frac{1}{\sum_{i=1}^{N} a_i} \sum_{i=1}^{N} a_i [s_i g(t - iT) + DC] \quad (2)$$

where N is the total number of symbols in the input burst signal and the symbols $a_i$ fulfill the relation (3).

$$c = \sum_{i=1}^{N} a_i \quad (3)$$

It is observed that c is chosen as a power of 2 for being easier to be practically implemented. Furthermore the symbols $a_i$ are chosen such that when the detector identifies the portion of the input burst signal the equation (4) is fulfilled.

$$\sum_{i=1}^{N} a_i s_i g(t - iT) = 0 \quad (4)$$

An amplification factor of the amplifier is chosen such that $$A_m = \frac{1}{c} \quad (5)$$

the constant c being defined by relation (3).

In an embodiment of the invention a modified identification circuit comprises the first serial to parallel converter for converting the input burst signal from a serial stream of symbols to the first parallel stream, said first serial to parallel converter being coupled to a subtractor. The subtractor subtracts the estimated additive component of the input signal burst from the first parallel stream and generates a difference signal that is inputted to a first multiplier coupled to the subtractor. The first multiplier multiplies the difference signal with a differentiated counterpart of a signal portion in the input burst signal together and generates a first product signal. The first product signal is inputted to a modulus circuit coupled to the first multiplier. The first modulus circuit performs a modulus determination of the first product signal and generates the first modulus signal. The first modulus signal is inputted to the threshold detector coupled to the modulus circuit, the threshold detector performing a comparison between the first modulus signal and a threshold signal which is indicative for detection of the signal portion of the input burst signal. The threshold detector generates the control signal whenever an input signal portion was detected.

In another embodiment of the invention both the method and the circuit are arranged for an input burst signal in the form of a complex signal comprising a real component and an imaginary component i.e. the imaginary component being phase shifted with substantially 90 degrees relatively to the real component. This signal, commonly identified as a quadrature signal, is extensively used in modern communication networks because the quadrature structure facilitates a further control of the signals and a quadrature detector and mixer are relatively easy realizable devices. Furthermore the quadrature structure of the signal facilitates applying Digital Signal Processing (DSP) techniques to the demodulated signals improving the quality of the received signals. In this case the first multiplier coupled to the modulus circuit and the second multiplier coupled to the first adder respectively are FIR digital filters.

In an embodiment of the invention the circuit is used in a communication system. In the communication system the additive parasitic component is fed-back to the difference circuit, said difference circuit performing a difference between an intermediate frequency signal and the parasitic additive component. The result of the subtraction is a burst signal having the additive parasitic component substantially zero. The input burst signal is also inputted in a slicer i.e. a differential input comparator.

In an embodiment of the invention the circuit is included in a second communication system. In the second communication system the additive parasitic component controls a local oscillator, said local oscillator generating a periodical signal that is inputted to a mixer. The mixer is coupled to the local oscillator and combines a radio frequency input burst signal with the periodical signal provided by the oscillator for obtaining an intermediate frequency signal. The intermediate frequency signal is inputted to a detector coupled to the mixer, the detector generating the input burst signal, said input burst signal having the additive parasitic component substantially zero. The DC offset of the signal is generated mainly in the mixer because of a frequency error in the periodical signal generated by the oscillator. The estimated offset is used to control the oscillator by controlling, the oscillation such that the DC offset signal is substantially reduced. In most of the situations the control signal is a voltage.

In another embodiment of the invention the circuit is used in a Bluetooth receiver. In a Bluetooth system the signals have a preamble indicating the beginning of a transmission. The circuit identifies the preamble and the DC estimation signal is generated during the time period of a burst signal. It is observed that the DC estimation could be inputted in both voltage control oscillator and difference circuit for further improving the accuracy of the DC estimation.

Figure 2:
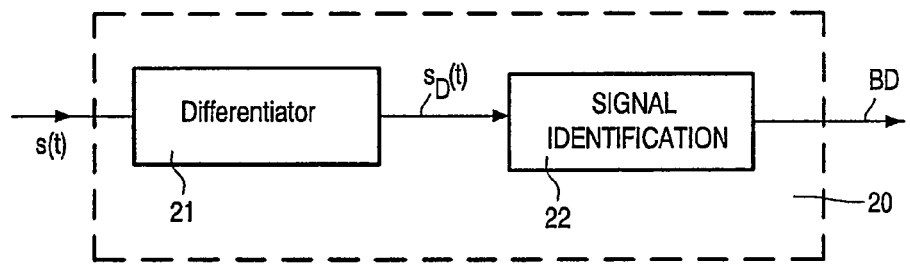
Figure 3:
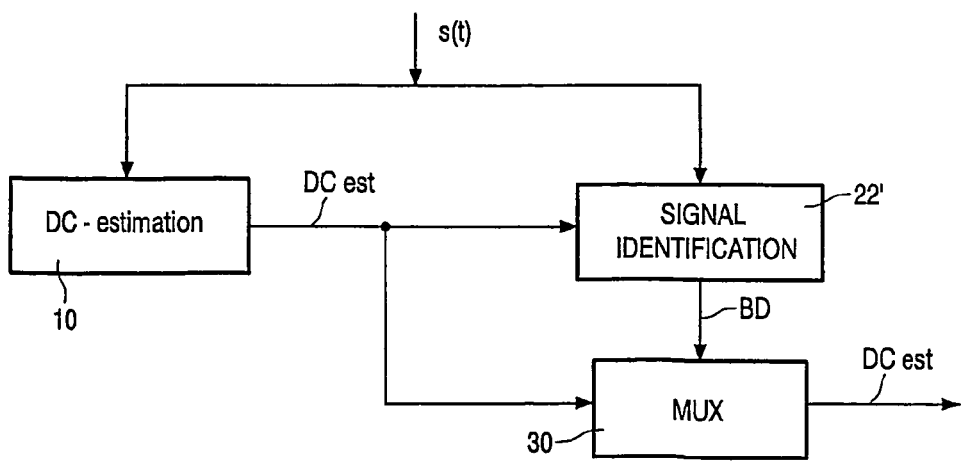
Figure 4:
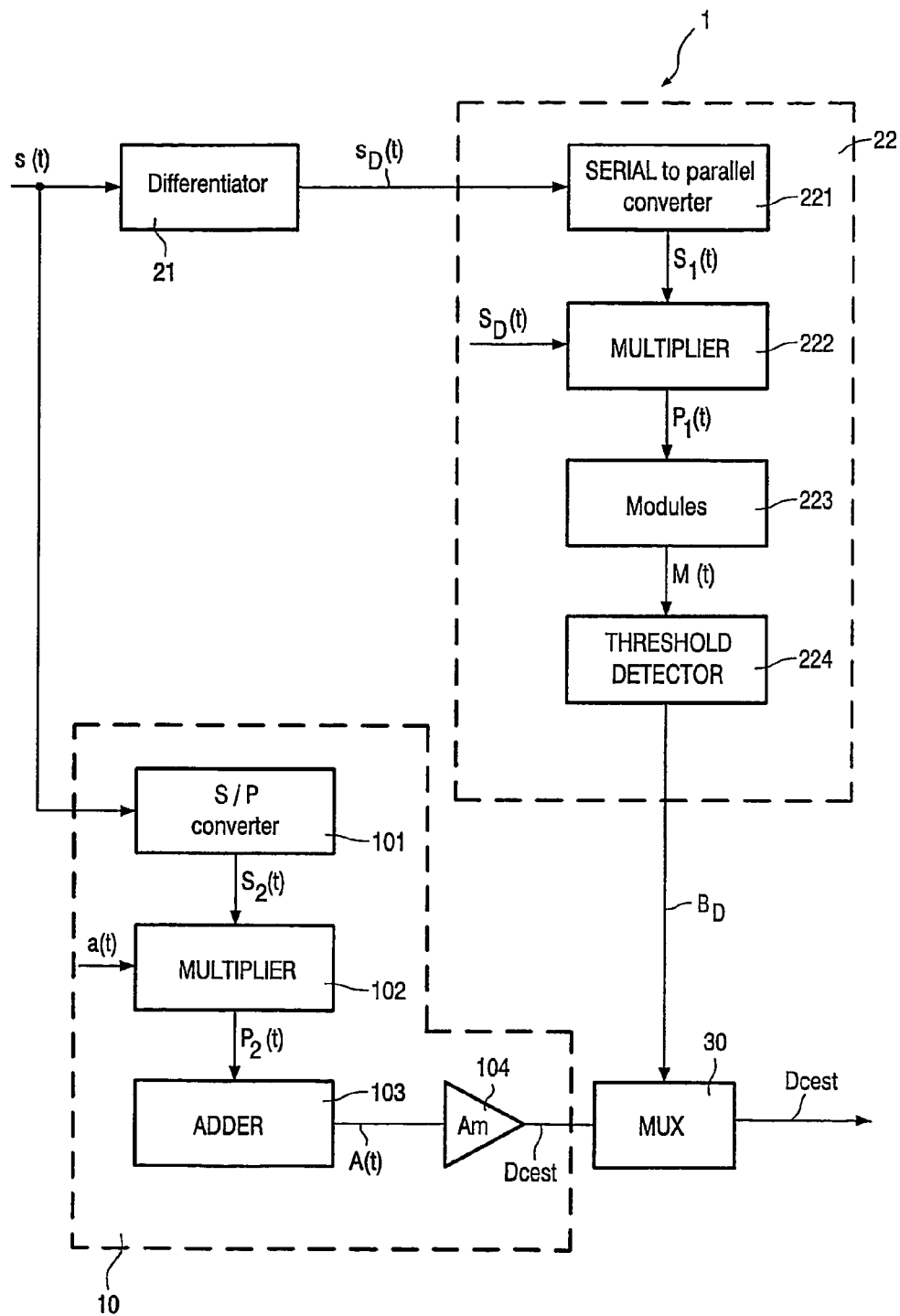
Figure 5:
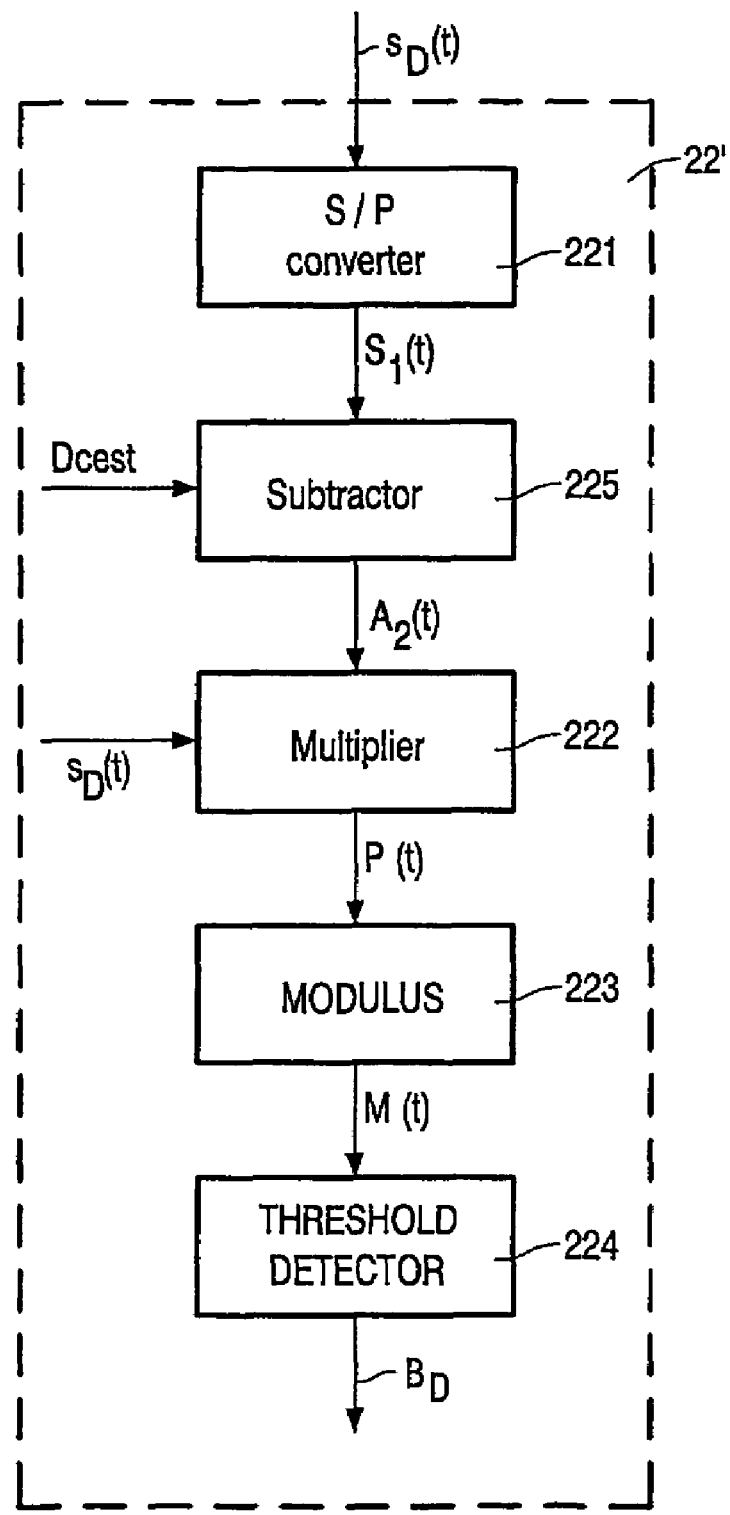
Figure 6:
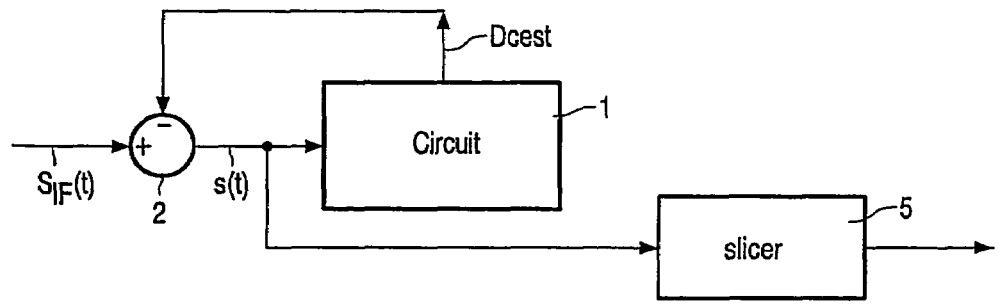
Figure 7:
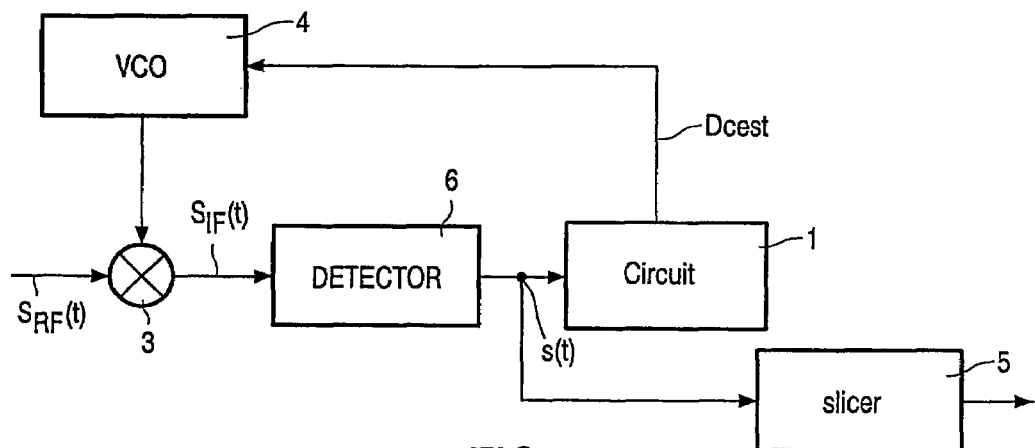
Figure 8:
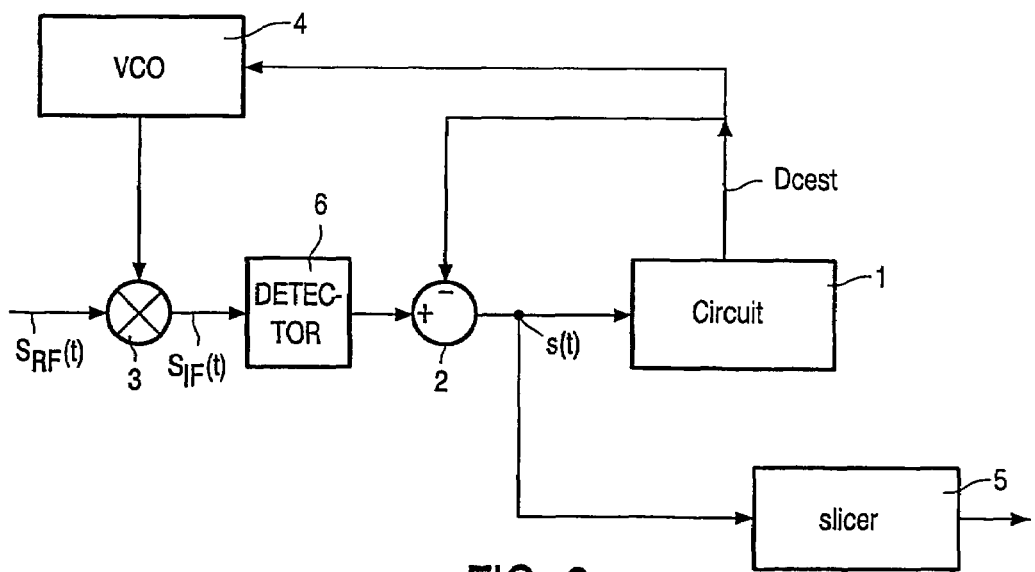

The above and other features and advantages of the invention will be apparent from the following description of the exemplary embodiments of the invention with reference to the accompanying drawings, in which:

FIG. 1 depicts an organigram of a method and a module diagram of a circuit for detecting an additive DC component included in a input burst signal according to the present invention FIG. 2 depicts a detailed diagram of an organigram of a method and a module diagram of a input burst signal detection according to the present invention, FIG. 3 depicts a variant of a circuit for detecting an additive DC component included in a input burst signal according to the present invention, FIG. 4 depicts a more detailed description of the circuit for detecting an additive DC component included in a input burst signal according to the present invention, FIG. 5 depicts a more detailed description of a modified signal detection circuit according to the present invention, FIG. 6 depicts a first communication system comprising using a circuit for detecting an additive DC component included in a input burst signal according to the invention, FIG. 7 depicts a second communication system using a circuit for detecting an additive DC component included in a input burst signal according to the invention, FIG. 8 depicts a third communication system using a circuit for detecting an additive DC component included in a input burst signal according to the invention.

FIG. 1 depicts an organigram of a method and a module diagram of a circuit for detecting an additive DC component included in a input burst signal s(t) according to the present invention. The method comprises a first step 10 for detecting an additive DC component included in an input burst signal s(t). In this first step a signal Dcest is generated, said signal being an estimation of the additive DC component included in the signal s(t). An additive DC component of the signal is a substantially constant signal i.e. it does not vary in time. The method also comprises a second step 20 for input burst signal detection, said detection being performed in the same time period as the estimation of the additive DC component included in the signal s(t). In e.g. Bluetooth and DECT systems an input burst signal includes a preamble comprising a specified sequence of symbols. In Bluetooth systems the preamble comprises 5 symbols and in DECT systems the preamble comprises 16 symbols. When a preamble is detected it means that there is a beginning of a input burst signal s(t) and the estimation of the DC component Dcest must be used by the system. When a input burst signal is detected a control signal BD is generated, said control signal BD determining whether the signal Dcest is released by the detection system via a switch 30, said switch being controlled by the control signal BD. It is observed that the signal Dcest is memorized for being used during the period of the burst. Said memory device could be e.g. a capacitor for storing an analog voltage or a binary memory for storing a digital information regarding the DC estimation. Accordingly the switch could be an analog one e.g. an analog switch or a digital one respectively.

FIG. 2 depicts a detailed diagram of an organigram of a method and a module diagram of a input burst signal detection according to the present invention. The second step 20 comprises a third step 21 for differentiating the input burst signal s(t) and generating a differentiated signal $s_d(t)$. The third step is for example implemented in a third circuit 21. The second step 20 further comprises a fourth step 22 for identifying the differentiated signal $s_d(t)$ as one of another plurality of signal portions, said another plurality of signal portions being obtained by differentiating the plurality of possible signal portions. According to the fourth step 22 there is a fourth module 22, the fourth module 22 being operable to identify the differentiated signal $s_d(t)$ as one of the predefined signal portions included in the differentiated signal $s_d(t)$. By differentiating with respect to time any time-dependent function comprising an additive DC component a DC-free signal results. Accordingly any of the signal portions are transformed to their differentiated counterparts. For example if the signal portion is binary and comprises a succession of symbols as [0, +1, −1, +1, −1, +1] that characterize a Bluetooth sequence, then the differentiated signal $s_d(t)$ comprises the sequence [−1, +1, −1, +1, −1] which is different than the signal portion.

FIG. 3 depicts a variant of a circuit for detecting an additive DC component included in a input burst signal according to the present invention. Whenever it is convenient for the simplicity of design procedure, cost or other technical and/or economical options, the circuit 1 for detecting an additive parasitic component of a input burst signal s(t) could be modified as follows. The DC estimated signal Dcest is inputted to the modified signal identification circuit 22' for eliminating an error that could appear in detecting the signal portion from the plurality of possible signal portions included in the input burst signal. The modified signal identification circuit 22' need not to have a differentiator, avoiding a supplementary delay of the burst-input signal s(t) but in the same time the hardware becomes relatively more complicated as it results from the other embodiments of the invention.

FIG. 4 depicts a more detailed description of the circuit for detecting an additive DC component included in a input burst signal according to the embodiments of the invention shown in FIG. 1 and FIG. 2.

It should be emphasized that the input burst signal could be either analogic or digital. If the signal is analogic then the predefined portion of it could be for example in the form of an electrical signal such a voltage or a current, or in a form of an optical, such as a light intensity. The signal could be phase, frequency and amplitude modulated. When a digital signal is considered the signal portion refers to a specified succession of bits. In this case the signal identification circuit 22 comprises a first serial to parallel converter 221 for converting the differentiated input burst signal $s_D(t)$ from a serial stream of symbols to a first parallel stream S1(t), said serial to parallel converter 221 being coupled to a first multiplier 222. The first multiplier 222 multiplies the first parallel stream S1(t) by a differentiated counterpart of a signal portion included in the input burst signal $S_D(t)$ and generates a first product signal P1(t). The first product signal P1(t) is inputted to a modulus circuit 223 coupled to the multiplier. The modulus circuit performs a modulus determination of the first product signal P1(t) and generates a first modulus signal M(t), the first modulus signal M(t) being inputted to a threshold detector 224 coupled to the modulus circuit. The threshold detector 224 performs a comparison between the first modulus signal M(t) and a threshold signal which is indicative for detection of a signal portion of the input burst signal s(t), the threshold detector generating the control signal BD whenever an input signal portion was detected.

The DC estimation circuit 10 comprises a second serial to parallel converter 101 for converting the differentiated input burst signal $s_D(t)$ comprising a serial stream of symbols to a second parallel stream S2(t). The second serial to parallel converter 101 is coupled to a second multiplier 102. The second multiplier 102 multiplies the second parallel stream P2(t) by a predetermined set of symbols a(t) having. The second multiplier 102 generates a second product signal P2(t) that is inputted to a first adder circuit 103 coupled to the second multiplier 102, the first adder 103 adding the a plurality of components included in the second product signal to each other. The first adder 103 generates a first adding signal A1(t), said first adding signal A1(t) being inputted in an amplifier 104 coupled to the first adder 103. The amplifier 104 performs an amplification of the first adding signal A1(t) with an amplification factor depending on the predetermined set of symbols a(t) defined by relations 3 and 5, the amplifier generating the estimated signal Dcest. It is observed that if the input burst signal is analogic then the internal structure of the circuit 1 is slightly modified i.e. the first and the second serial to parallel converters are not necessary. Furthermore all the other circuits included in the circuit 1 are analog. The threshold detector 224 could be a differential comparator with an output providing a binary signal e.g. generating a logical 1 when the first modulus signal is greater than the threshold level and a logical 0 otherwise. It is further observed that a modulus circuit 223 doubles the number of signal portions that are used in signal detection. For example, considering that the signal portion used in detection is coded using 5 bits then a total number of 32 different signal portions are obtained. Modulus circuit reduces the total number of signal portions to 16 because a signal portion $s_p$ and it's inverse non($s_p$) have the same modulus. When a larger part of the input signal portions are used a bank of multipliers and threshold detectors can be used when it is necessary to detect a plurality of input signal portions.

FIG. 5 depicts a more detailed description of a modified signal detection circuit according to the present invention. The modified identification circuit comprises the first serial to parallel converter 221 for converting the input burst signal s(t) from a serial stream of symbols to the first parallel stream S1(t), said first serial to parallel converter 221 being coupled to a subtractor 225. The subtractor 225 subtracts the estimated additive component of the input signal burst Dcest from the first parallel stream S1(t) and generates a difference signal A2(t), the difference signal A2(t) being inputted in a first multiplier 222 coupled to the subtractor 225. The first multiplier 222 multiplies the difference signal A2(t) by a differentiated counterpart of a signal portion included in the burst signal $S_D(t)$ and generates a first product signal P1(t). The first product signal P1(t) is inputted in a modulus circuit 223 coupled to the first multiplier 222. The first modulus circuit 223 performs a modulus determination of the first product signal P1(t) and generates the first modulus signal M(t). The first modulus signal M(t) is inputted to the threshold detector 224 coupled to the modulus circuit 223, the threshold detector 224 performing a comparison between the first modulus signal M(t) and a threshold signal which is indicative for detection of the signal portion of the input burst signal s(t). The threshold detector generates the control signal BD whenever an input signal portion was detected. The above mentioned circuit is suitable to be implemented especially in receivers working with input signals having relatively low levels of DC additive components. In this situation the circuit for DC estimation 10 provides a sufficiently accurate Dcest signal such that the signal portion included in the input burst signal is detected practically without error.

FIG. 6 depicts a first communication system comprising using a circuit for detecting an additive DC component included in a burst signal according to the invention. The first communication system comprises a circuit 1 wherein the additive parasitic component Dcest is fed-back to difference circuit 2, said difference circuit 2 performing a difference between an intermediate frequency signal $S_{IF}(t)$ and the parasitic additive component Dcest for generating a input burst signal s(t) having the additive parasitic component substantially zero. This is a relatively simple way to reduce a DC component in an input burst signal. The correction of the input signal $S_{IF}(t)$ is made as quickly as possible and the method is suitable for relatively high speed input signal streams as a low cost solution.

FIG. 7 depicts a second communication system using a circuit for detecting an additive DC component included in a input burst signal according to the invention. The second communication system comprises a circuit 1 wherein the additive parasitic component Dcest controls a local oscillator 4 generating a periodical signal, said periodical signal being inputted to a mixer 3 coupled to the local oscillator 4. The mixer 3 combines an input radio-frequency burst signal $S_{RF}(t)$ with the periodical signal of the oscillator 4 for obtaining an intermediate frequency signal $S_{IF}(t)$. The intermediate frequency signal $S_{IF}(t)$ is inputted to a detector 6 coupled to the mixer 3, the detector 6 generating the input burst signal s(t), said input burst signal s(t) having the additive parasitic component substantially zero. This solution provides a more accurate estimation of the DC additive component in the input burst signal but the time required for controlling the voltage controlled oscillator 4 and obtaining the input burst signal s(t) practically error free is longer that in the previous case because of the detector 6. In an embodiment the detector 6 is a FM detector coupled to phase-shift detector, the phase-shift being an indication for the presence of a DC component in the input burst signal. If the signal $S_{IF}(t)$ is analogic the detector 6 comprises a hard limiter coupled to a FM detector. If the input signal $S_{IF}(t)$ is a stream of symbols the phase-shift detector included in the detector 6 could be a CORDIC processor. A CORDIC processor makes mathematical operations as calculus of sine and cosine functions in a very precise way using specific algorithms. In Bluetooth and DECT systems the voltage controlled oscillator 4 is a quadrature oscillator generating a complex signal having a first component I and a second component Q phase-shifted with 90 degrees to each other. The voltage controlled oscillator is controlled either analogically or digitally. A control signal is an analogic voltage when the control is analogic and the control signal is a numerical code when a digital control is applied.

FIG. 8 depicts a third communication system using a circuit for detecting an additive DC component included in an input burst signal according to the invention. This third communication system is a combination of the first communication system and the second communication system. This provides a better solution for the DC component detection and it's elimination from an input burst signal. It is remarked that this solution is more expensive than the previously presented ones. Furthermore, the detection and correction of the DC component in an input burst signal lasts the longest period of time. But in systems as TDMA and CDMA these are not major setbacks. Furthermore it is observed that the portion of the signal that has to be detected could be also in a mid-amble of the signal as in CDMA systems.

It is remarked that the scope of protection of the invention is not restricted to. the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features.

The invention claimed is:

1. A method for processing an input burst signal following a circuit path comprising:
    a first step for identifying an additive DC component present in the input burst signal at a first point in the circuit path and generating an output signal, which is representative for an estimated value of said DC component;
    a second step for detecting a predetermined signal portion from a plurality of possible signal portions included in the input burst signal and generating a control signal indicating the presence of the predetermined signal portion in the input burst signal, characterized in that the first step and the second step are performed in parallel in a commonly defined time interval from a starting time of the burst; and,
    in response to the control signal, a step for providing feedback, using the output signal, to the signal path to create a corresponding change in the DC component of input burst signal at said first point.

2. A method as claimed in claim 1 wherein the second step comprises a third step for differentiating the input burst signal and generating a differentiated signal, a fourth step for identifying the differentiated signal as a predetermined one of another plurality of signal portions representing a derivative of the plurality of possible signal portions included in the input burst signal.

3. A method as claimed in claim 1 applied to the input burst signal, said signal being a complex signal comprising a real component and an imaginary component, the imaginary component being phase shifted by substantially 90° relative to the real component.

4. A circuit for processing an input burst signal following a circuit path comprising:
    a first module for estimating an additive DC component present in the input burst signal at a first point in the circuit path and generating an output signal representative for said estimation;
    a second module for identifying a predetermined signal portion from a plurality of possible signal portions included in the input burst signal and generating a control signal indicative for a presence of the signal portion from the plurality of the possible signal portions, characterized in that the first module and the second module operate in the same time interval in a commonly defined time interval from a starting time of the burst; and
    a module for, in response to the control signal, providing feedback, using the output signal, to create a conrresponding change in the DC component of input burst signal at said first point.

5. A circuit as claimed in claim 4 wherein the second module comprises a differentiator for differentiating the input burst signal and generating a differentiated signal, said differentiator being coupled to a signal identification circuit, the signal identification circuit being operable to identify the differentiated signal as a predetermined one of another plurality of signal portions representing a derivative of the plurality of possible signal portions included in the input burst signal.

6. A circuit as claimed in claim 5 wherein the control signal is a binary signal.

7. A circuit as claimed in claim 6 wherein the control signal controls a switch coupled to the first module, said switch generating the output signal representative for said estimation of the additive DC component present in the input burst signal, when the signal portion from the plurality of possible signal portions included in the input burst signal is detected.

8. A circuit as claimed in claim 4 wherein the output signal representative for the estimation of the additive DC component present in the input burst signal is inputted in a modified signal identification circuit for eliminating an error that could appear in detecting the signal portion from the plurality of possible signal portions included in the input burst signal.

9. A circuit as claimed in claim 5 wherein the signal identification circuit comprises a first serial to parallel converter for converting the input burst signal from a serial stream of symbols to a first parallel stream, said serial to parallel converter being coupled to a first multiplier, said first multiplier performing a multiplication of the first parallel stream by a differentiated counterpart of a signal portion included in the input burst signal and generating a first product signal, the first product signal being inputted in a modulus circuit coupled to the multiplier, said modulus circuit performing a modulus determination of the first product signal and generating a first modulus signal, said first modulus signal being inputted in a threshold detector coupled to the modulus circuit, the threshold detector performing a comparison between the first modulus signal and a threshold signal which is indicative for detection of a signal portion of the input burst signal, the threshold detector generating the control signal whenever an input signal portion was detected.

10. A circuit as claimed in claim 4 wherein the DC estimation circuit comprises a second serial to parallel converter for converting the input burst signal comprising a serial stream of symbols to a second parallel stream, said second serial to parallel converter being coupled to a second multiplier, the second multiplier multiplying the second parallel stream by a predetermined set of symbols, the second multiplier generating a second product signal being inputted in a first parallel adder circuit coupled to the second multiplier, the adder adding the plurality of components included in the second product signal to each other, the first adder generating a first adding signal, said first adding signal being inputted in an amplifier coupled to the adder, said amplifier performing an amplification of the first adding signal with an amplification factor depending on the predetermined set of symbols, the amplifier generating the estimated signal.

11. A circuit as claimed in claim 8 wherein the modified identification circuit comprises the first serial to parallel converter for converting the input burst signal comprising a serial stream of symbols to the first parallel stream, said first serial to parallel converter being coupled to a subtractor, the subtractor subtracting the estimated additive component of the input signal burst from the first parallel stream and generating a difference signal that is inputted in a first multiplier coupled to the subtractor, the first multiplier performing a multiplication between the difference signal and a predetermined set of symbols included in the input burst signal and generating a first product signal, the first product signal being inputted in a modulus circuit coupled to the first multiplier, the first modulus circuit performing a modulus determination of the first product signal and generating the first modulus signal, said first modulus signal being inputted in the threshold detector coupled to the modulus circuit, the threshold detector performing a comparison between the first modulus signal and a threshold signal which is indicative for detection of the signal portion of the input burst signal, the threshold detector generating the control signal whenever an input signal portion was detected.

12. A circuit as claimed in claim 4 which is adapted for an input burst signal in the form of a complex signal comprising a real component and an imaginary component, the imaginary component being phase shifted by substantially 90° relative to the real component.

13. A first communication system comprising a circuit as claimed in claim 4, wherein the output signal representative for said estimation is fed-back to a difference circuit, said difference circuit calculating a difference between an intermediate frequency signal and the parasitic additive component for generating a input burst signal having the output signal representative for said estimation substantially zero.

14. A second communication system comprising a circuit as claimed in claim 4, wherein the output signal representative for said estimation controls a local oscillator generating a periodical signal that is inputted in a mixer coupled to the local oscillator, said mixer combining an input radio-frequency burst signal with the periodical signal of the oscillator for obtaining an intermediate frequency signal, the intermediate frequency signal being inputted to a detector coupled to the mixer, the detector generating the input burst signal, said input burst signal having output signal representative for said estimation substantially zero.

15. A second communication system as claimed in claim 14 wherein the voltage controlled oscillator is a quadrature oscillator.

16. A communication system as claimed in claim 13, included in a receiver system that uses GFSK (Gaussian Frequency Shift Keying) modulation and wherein the receiver system identifies the input burst signal by recognizing a preamble represented by a predefined succession of symbols that correspond to said predetermined signal portion.

* * * * *